United States Patent [19]

Noguchi et al.

[11] Patent Number: 4,608,748
[45] Date of Patent: Sep. 2, 1986

[54] METHOD OF MANUFACTURING A MEMORY FET WITH SHORTED SOURCE AND DRAIN REGION

[75] Inventors: Hideo Noguchi, Yokohama; Tugunari Iwamoto, Kawasaki, both of Japan

[73] Assignee: Tokyo Shibaura Denki Kabushiki Kaisha, Kawasaki, Japan

[21] Appl. No.: 390,032

[22] Filed: Jun. 18, 1982

[30] Foreign Application Priority Data

Jun. 30, 1981 [JP] Japan ............... 56-100654
Jun. 30, 1981 [JP] Japan ............... 56-100655
Jun. 30, 1981 [JP] Japan ............... 56-100656

[51] Int. Cl.⁴ .................. H01L 21/38; H01L 21/425
[52] U.S. Cl. ................................ 29/571; 29/576 B; 29/577 C; 148/1.5; 148/187
[58] Field of Search ........... 29/571, 576 B, 577 C; 148/187, 1.5

[56] References Cited

U.S. PATENT DOCUMENTS

| 3,865,650 | 2/1975 | Arita ............... 148/187 |
| 3,865,651 | 2/1975 | Arita ............... 148/187 |
| 3,969,150 | 7/1976 | Luce ............... 148/1.5 |
| 4,080,718 | 3/1978 | Richman ............... 148/187 X |
| 4,151,020 | 4/1979 | McElroy ............... 148/187 |
| 4,230,504 | 10/1980 | Kuo ............... 148/1.5 |
| 4,246,044 | 1/1981 | Yanase ............... 148/1.5 |
| 4,268,950 | 5/1981 | Chatterjee et al. ............... 29/571 |
| 4,365,405 | 12/1982 | Dickman et al. . | |
| 4,397,887 | 8/1983 | Aytac et al. ............... 29/571 X |

FOREIGN PATENT DOCUMENTS

| 51-28551 | 8/1976 | Japan . |
| 52-32557 | 8/1977 | Japan . |
| 53-75781 | 7/1978 | Japan . |
| 56-3688 | 1/1981 | Japan . |

Primary Examiner—George T. Ozaki
Attorney, Agent, or Firm—Finnegan, Henderson, Farabow, Garrett & Dunner

[57] ABSTRACT

A method of manufacturing a semiconductor device having a plurality of MOS transistors which construct a memory section. After forming a plurality of MOS transistors on a semiconductor substrate, source regions and drain regions of given MOS transistors are shorted in accordance with a requested program. An insulating film is subsequently formed on the MOS transistors and an interconnection wiring layer is further formed thereon.

9 Claims, 26 Drawing Figures

F I G. 4A
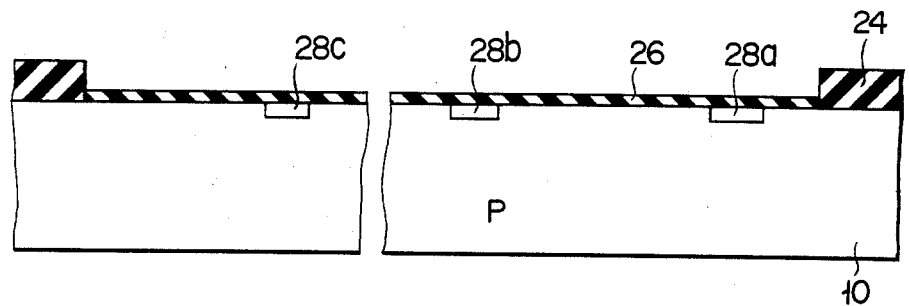
F I G. 4B
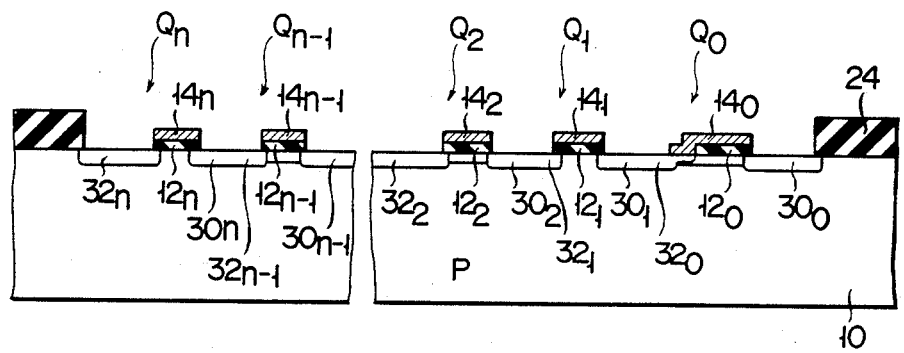
F I G. 4C
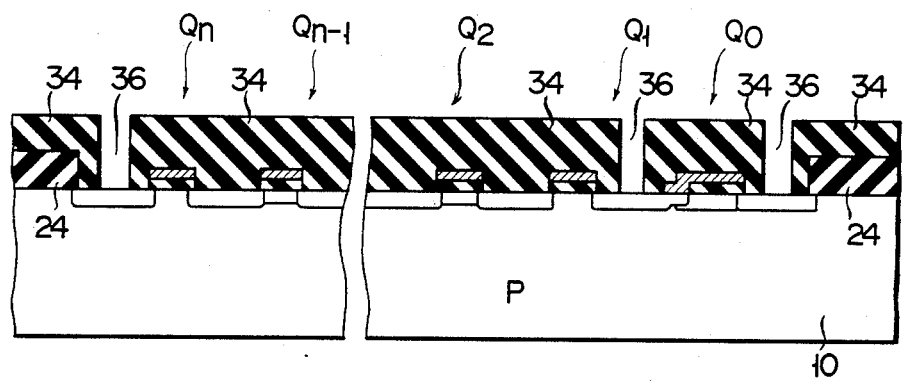

F I G. 8
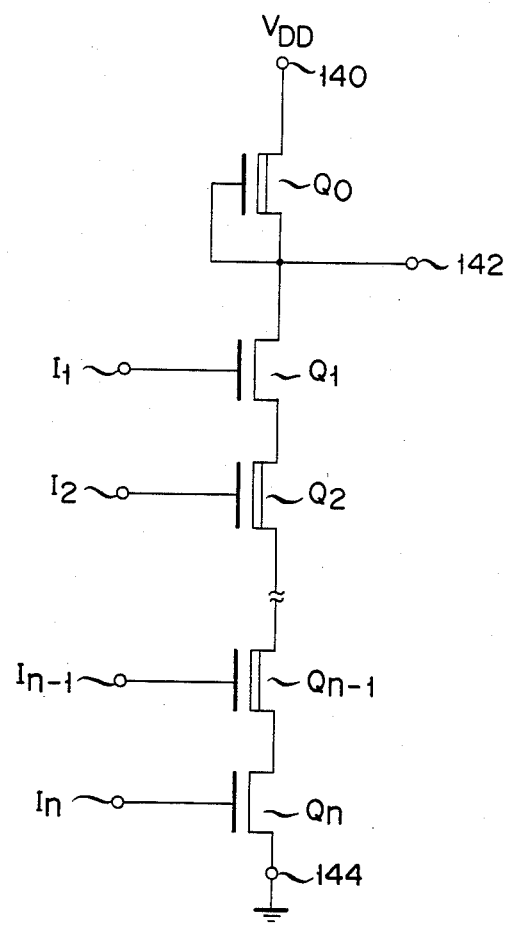

F I G. 10A
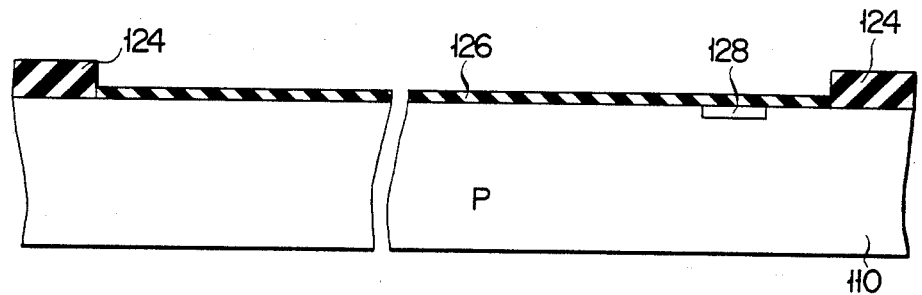
F I G. 10B
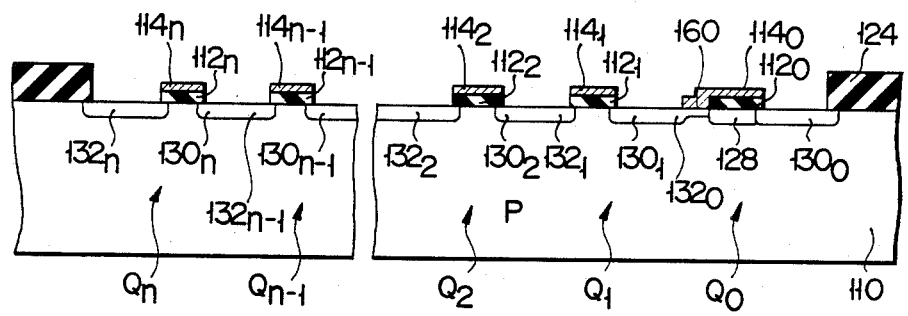
F I G. 10C
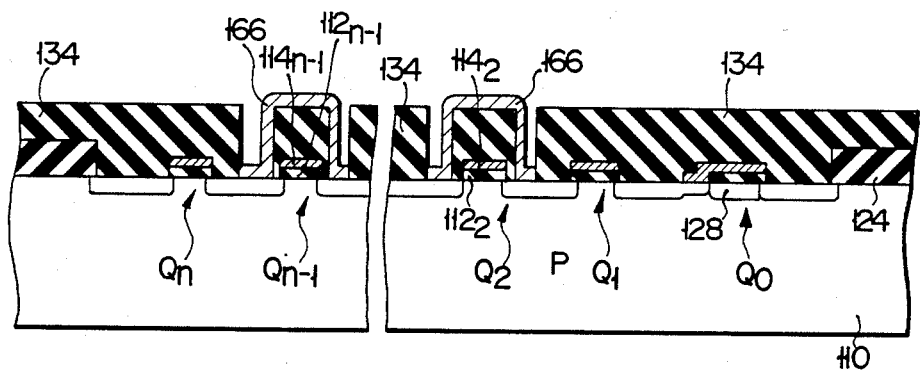

METHOD OF MANUFACTURING A MEMORY FET WITH SHORTED SOURCE AND DRAIN REGION

BACKGROUND OF THE INVENTION

The present invention relates to a method of manufacturing a semiconductor device and, more particularly, to a method of manufacturing a semiconductor device for forming, for example, a memory circuit by using MOS FETs.

The semiconductor devices shown in FIGS. 1 to 3 are already known, as disclosed in Japanese Patent Publication No. 56-3688. FIG. 1 shows a plan view of a part of the semiconductor device; FIG. 2 is an equivalent circuit of the semiconductor device; and FIG. 3 is a cross sectional view taken along line III—III in FIG. 1.

As shown in FIGS. 1 to 3, a gate insulating film 12 and a gate electrode 14 are formed in the semiconductor device on a P type semiconductor substrate 10. An N+ region 16 is formed between gate electrodes by the diffusion process. In the circuit shown in FIG. 1, MOS transistors Q11, Q21 and Q31 and MOS transistors Q12, Q22 and Q32 are connected in series. The load transistors are not shown.

The number of gates provided in the semiconductor devices depend on the specification given by a user. For example, in order to render the MOS transistor Q22 nonoperative and reduce the input terminals by one, the source and drain of the MOS transistor Q22 are shorted by means of an ion implanted layer 18.

The prior semiconductor devices are fabricated by the manufacturing process, as shown in FIGS. 4A to 4E. According to the manufacturing process, however, the process of the ion implantation as mentioned above is performed at the initial stage of the wafer process. This leads to a delay in the appointed date of delivery.

A manufacturing method of a prior semiconductor device will be described referring to FIGS. 4A to 4E. As shown in FIG. 4A, a field oxide film 24 of 8,000 to 15,000 Å in thickness is formed over a P type semiconductor substrate 10, as shown in FIG. 4A. Next, a field oxide film 24 on the active region in which elements are formed is removed. At this portion, an SiO$_2$ film 26 for the gate oxide film of 500 to 1,000 Å is formed by the thermal oxidizing process. With a photoresist mask on the surface of the semiproduct, N type impurity ions are implanted into a portion of the semiproduct where a channel of a depletion type MOS transistor is formed, thereby forming N type impurity regions 28a to 28c. The depletion type MOS transistors are used as a load MOS transistor Q0 serving as a drive section of an inverter, and also as elements Q2 and Qn−1 for storing "0" in the memory region. The N type impurity region 28a is used for the load MOS transistor and the regions 28b and 28c are used for the depletion type in the driver (memory) MOS transistors. Data is stored by rendering given elements, such as Q2 and Qn−1, into depletion type in accordance with the memory contents. Where in the memory region N type impurity for forming the depletion type elements is implanted is determined by the customer's order. A mask exclusively used for this implantation is prepared.

A polysilicon layer for the gate electrode of 3,000 to 4,000 Å in thickness is then deposited on the SiO$_2$ film 26. The gate of the load MOS transistor Q0 of the drive section is shorted to its source in a buried contact manner, as shown in FIG. 4B. This is realized by removing in advance a part of the SiO$_2$ oxide film 26 on the region where the source of the load transistor Q0 is formed and then depositing polysilicon. After patterning the polysilicon layer by a photoengraving process, the SiO$_2$ film 26 is etched away with a mask of the polysilicon layer, thereby forming gate oxide films $12_0$ to $12_n$ and gate electrodes $14_0$ to $14_n$. In the next step, with a mask of the gate electrodes $12_0$ to $12_n$, N type impurity is diffused into the semiproduct to form the drain regions $30_0$ to $30_n$ and the source regions $32_0$ to $32_n$ of MOS transistors Q0 to Qn. Because the load MOS transistor Q0 and the predetermined transistors Q2 and Qn−1 of the driver MOS transistors have N type ions injected into the channel region between the source and drain in the step mentioned above, they are depletion type transistors. The remaining transistors are of the enhancement type (FIG. 4B).

An SiO$_2$ film 34 of 2,000 to 6,000 Å is formed on a semiconductor substrate 10 as a protective film, as shown in FIG. 4C. Contact holes 36 for interconnection wirings are formed by the photoengraving process on the drain region $30_0$, on the source region $32_0$ of the load MOS transistor Q0, and on the source region $32_n$ of the transistor Qn.

As shown in FIG. 4D, a surface smoothing layer 38 of the 5,000 to 7,000 Å thickness is deposited on the semiconductor substrate. To form the contact holes 36 for wiring, the surface smoothing layer 38 is etched. As shown in FIG. 4E, aluminum is vapor-deposited and etched to form a V$_{DD}$ power source electrode 40, an output electrode 42 and a V$_{SS}$ electrode 44. A protective film is then formed over the entire surface and bonding pads to exterior are formed thereon. At this stage, the chip fabrication process is completed.

The operation of a semiconductor device formed through the steps mentioned above will be described. The semiconductor device produces the contents of the selected transistor at the output electrode 42 in response to the select signal to the gate electrodes $14_1$ to $14_n$ of the driver MOS transistors Q1 to Qn. When the transistor Q1 is selected and only the gate electrode $14_1$ is at low potential, the circuit is electrically cut off by the transistor Q1 because this transistor is of the enhancement type. Accordingly, the output signal is at the power source potential. This means that logic "1" has been stored in the transistor Q1. When the transistor Q2 is selected, and only the gate electrode $14_2$ is at low potential, i.e. about 0 V, the transistor Q2 has a shortcircuit between the source and drain because this transistor is of the depletion type. Accordingly, the conductive state of the circuit is maintained and never electrically cut off. Accordingly, the output signal is at low potential. This means that logic "0" has been stored in the transistor Q2. In this way, data are stored in the memory region by forming the MOS transistors Q1 to Qn into two types, the enhancement type and the depletion type.

In the prior manufacturing method, the impurity implantation into the channel region for forming the depletion type MOS transistor in the memory region is performed at the initial stage in the entire manufacturing process. The determination of which transistor should be of a depletion type depends on the type of the data to be stored. Actually, after the mask pattern is determined by a customer's order, the ion implantation is performed. Various process steps such as impurity diffusing step for forming the source and drain are subsequently performed before the semiconductor device is completed. Therefore, it is time-consuming to manufacture and deliver semiconductor products according to a customer's order. In this respect, the manufactures have not fully satisfied to the customer's demand.

Proposals to cope with this problem are disclosed in U.S. Pat. No. 4,080,718 and Japanese laid-open patent application No. 53-75781. In these proposals, impurity is introduced into the channel region by the ion-implantation in the final stage, in order to render the MOS transistor into a deletion type.

In the final step, a PSG layer or a CVD layer is etched and impurity is then introduced into the semiconductor substrate by the ion-implantation process. The semiconductor device thus fabricated is delivered as is. Accordingly, its reliability is poor.

When the PSG layer and the CVD layer on the gate electrode are removed for making an ion-implantation, the Al interconnection wiring is not located on the gate electrodes to be opened. This state will be described referring to FIGS. 5 and 6. FIG. 5 shows a plan view of the semiconductor device and FIG. 6 is a cross sectional view taken along line VI—VI in FIG. 5. A gate electrode 14 is formed on the semiconductor substrate 10, with a gate insulating film 12 disposed therebetween. An N type impurity region 28, which will be the source, and drain regions are formed on both sides of the gate electrode 14. An Al interconnection wiring 52 is formed orthogonal to the gate electrode 14. In order to short the source and drain of one MOS transistor, the region 50 must be opened. In this case, care must be taken so as to etch away the Al wiring 52 on the field oxide film 24. Accordingly, the MOS transistor and the Al wiring 52 must be disposed separately. As a result, the integration density is correspondingly reduced.

SUMMARY OF THE INVENTION

An object of the present invention is to provide an improved method of manufacturing a semiconductor device which can deliver the products of the semiconductor more quickly than could prior processes.

To achieve the above object, in the manufacturing method of the present invention, given source and drain regions are shorted in accordance with a requested program after a plurality of MOS transistors are formed on the semiconductor substrate. An insulating film is then formed on the shorted MOS transistors and an interconnection wiring layer is formed thereon.

In order to short the source and drain regions, impurity ions of the same conductivity type as that of the source and drain regions are implanted in the semiconductor substrate sandwiched by the source and drain regions. Alternatively, the source and drain regions are opened to allow impurity to be diffused into them. The source region and the drain region may be shorted by a polysilicon layer.

BRIEF DESCRIPTION OF THE DRAWINGS

Other objects and advantages of this invention will become apparent from the following description taken in connection with the accompanying drawings, in which:

FIGS. 4A to 4E are cross sectional views useful in explaining a prior method of manufacturing the semiconductor device shown in FIG. 1;

FIG. 8 is a logic circuit of a semiconductor device shown in FIG. 7E;

FIGS. 10A to 10E are cross sectional views of a semiconductor substrate explaining a third method of manufacturing a semiconductor device according to the present invention.

DETAILED DESCRIPTION OF THE PREFERRED EMBODIMENTS

An embodiment of a method of manufacturing a semiconductor device according to the present invention will be described referring to FIGS. 7A to 7E.

An $SiO_2$ field oxide film 124 of 8,000 to 15,000 Å is formed over the entire surface of a P type silicon substrate 110 doped with boron by the thermal oxidation process. The field oxidation film 124 on an active region on the substrate in which elements are formed is removed by the photoengraving process. An $SiO_2$ 126 of 500 to 1,000 Å in thickness serving as a gate oxide film is formed on the exposed surface of the semiconductor substrate 110. Implantation of monovalent phosphorus ions is performed in order to form an N type impurity region 128, which in turn forms a depletion type MOS transistor serving as a load MOS transistor in the circuit. The region 128 is formed so that the source and drain are shorted corresponding to a channel region between the source and drain of a load MOS transistor which is to be formed in the succeeding process. In this step, the prior method forms N type impurity regions in the channel regions of the depletion type MOS transistors simultaneously provided in the memory region. However, the present embodiment does not need to form such regions.

Figure 1:
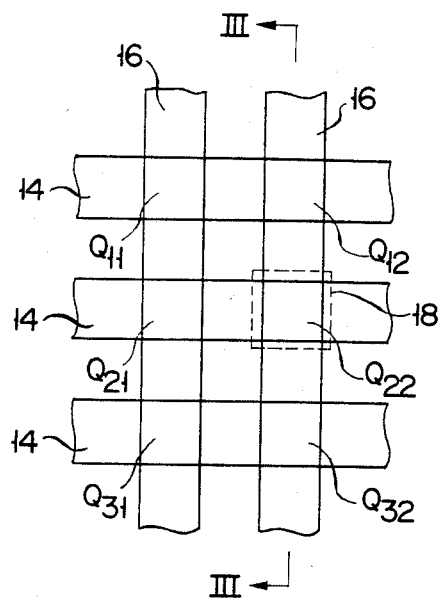
FIG. 1 is a plan view of a known semiconductor device.
Figure 2:
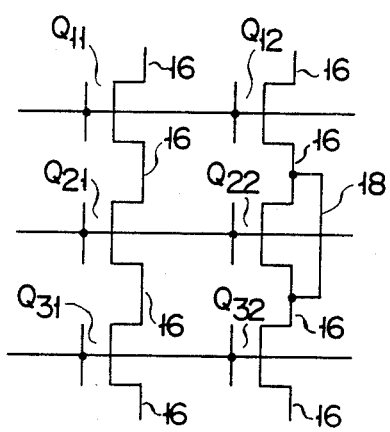
FIG. 2 is an equivalent circuit of the semiconductor device shown in FIG. 1.
Figure 3:
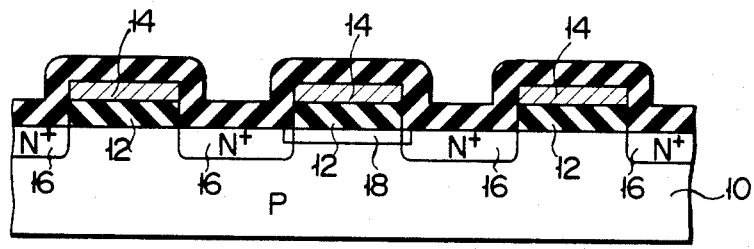
FIG. 3 is a cross sectional view taken along line III—III in FIG. 1.
Figure 4D:
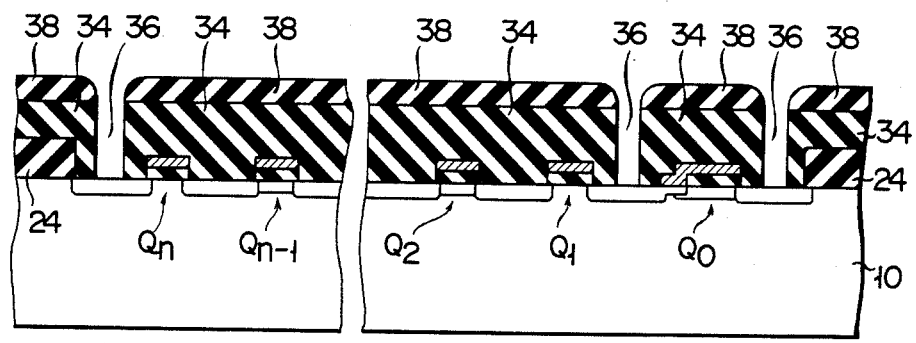
Figure 4E:
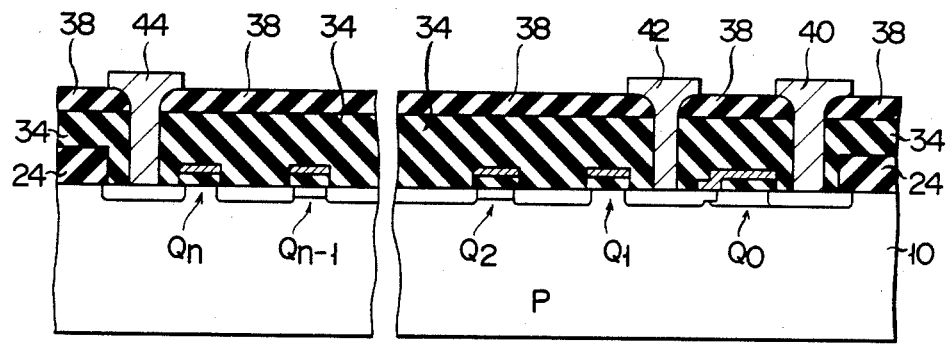
Figure 5:
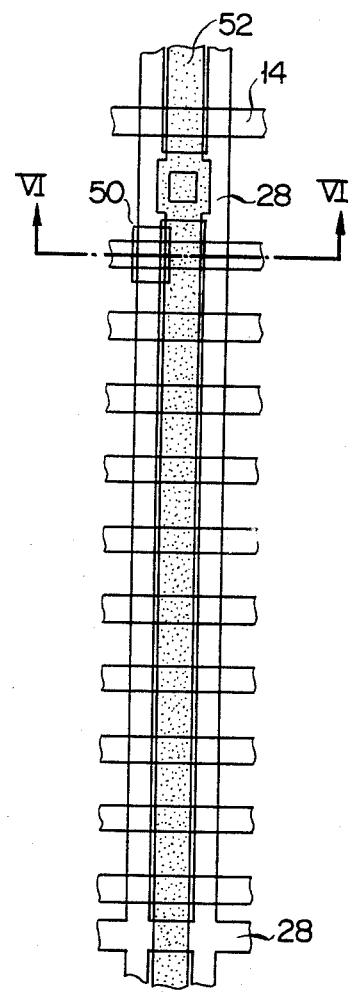
FIG. 5 is a plane view useful in explaining another prior manufacturing method.
Figure 6:
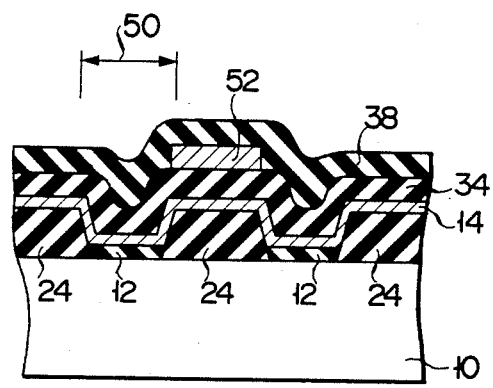
FIG. 6 is a cross sectional view taken on line VI—VI of the semiconductor device shown in FIG. 5.
Figure 7A:
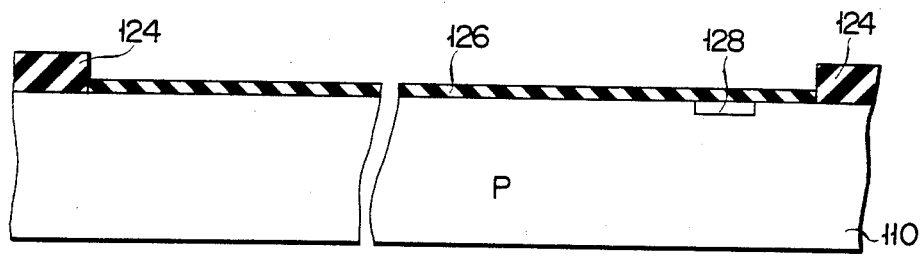
FIGS. 7A to 7E are cross sectional views illustrating a first method of manufacturing a semiconductor device according to the present invention.
Figure 7B:
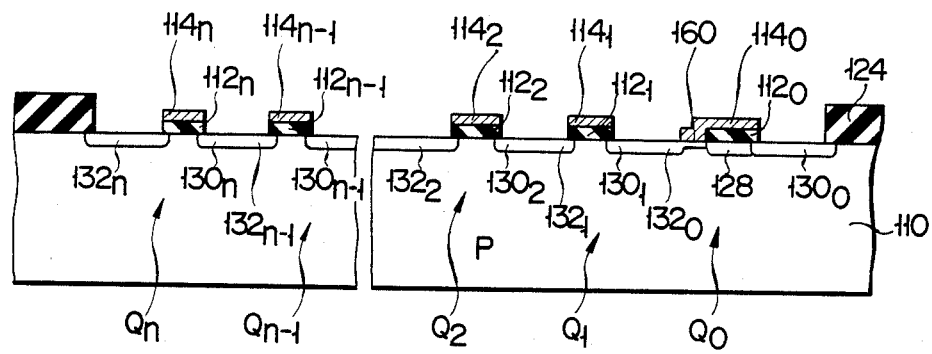

The gate electrode of a polysilicon layer is then formed. At this time, so that the gate electrode of the load MOS transistor comes in buried contact with the source region, a part of the $SiO_2$ film 126 on the substrate 110 on which the source region is formed is etched away. A polysilicon layer of 3,000 to 4,000 Å is deposited over its entire surface by the CVD process. The polysilicon is subjected to a photoengraving process to form a given pattern, and thus gate electrodes $114_0$ to $114_n$ are formed. At this time, the buried contact region 160 is also formed. With a mask of the gate electrodes $114_0$ to $114_n$, the $SiO_2$ 126 is etched away to form gate oxide films $112_0$ to $112_n$. In the next step by using the gate oxide films $112_0$ to $112_n$ as a mask, phosphorus is diffused into the semiproduct in $POCl_3$ atmosphere to form $N^+$ type drain and source regions $130_0$ to $130_n$ and $132_0$ to $132_n$ (FIG. 7B). At this time, if, for example, N type impurity of phosphorus is injected into the semiproduct by the implantation process with the mask of the gate electrodes $114_0$ to $114_n$, the source and drain regions $130_0$ to $130_n$, and $132_0$ to $132_n$ may be formed without etching the $SiO_2$ film 126. At this stage, only the load MOS transistor Q0 is of the depletion type, while the remaining MOS transistors Q1 to Qn are of the enhancement type.

Figure 7C:
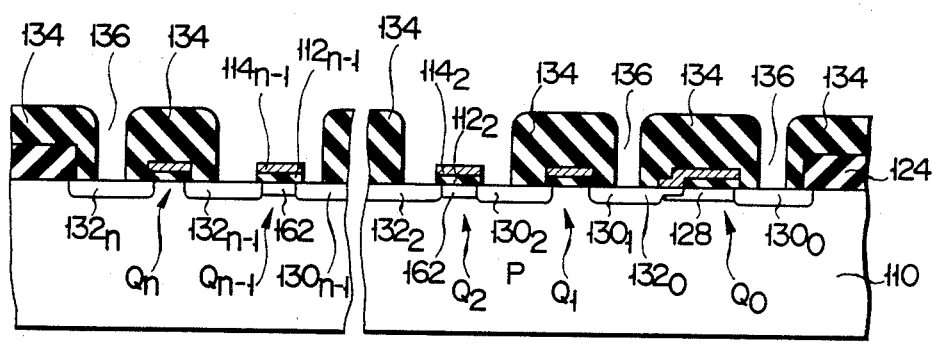

As shown in FIG. 7C, an $SiO_2$ film 134 of 2,000 to 6,000 Å is formed on its surface as a second insulating layer by the CVD process. Contact holes 136 for a power source terminal, output terminals and ground terminals are formed in the $SiO_2$ film 134. At this time, the $SiO_2$ film 134 covering the transistors Q2 and Qn−1 which should be of the depletion type of those transistors Q1 to Qn on the basis of the information to be stored, is etched away. By using the $SiO_2$ film 134 as a mask, impurity divalent phosphorus ions $P^{++}$ of N type with energy of 160 KeV are implanted into a channel region through gate electrodes $114_2$ and $114_{n-1}$ and gate oxide films $112_2$ and $112_{n-1}$. The second N type region 162 for shorting the source and drain of each of the transistors Q2 and Qn−1 is then formed, and the transistors Q2 and Qn−1 are rendered into depleton types (FIG. 7C). At this time, ions are simultaneously implanted into the semiconductor substrate 110 of the contact hole portion 136 for the electrode terminal 136. The $N^+$ type regions $130_0$, $130_1$, $132_0$ and $132_n$ have been formed on the substrate portion. Therefore, the ion implantation only deepens the diffusion layer deeper and does not adversely affect the characteristic in any way.

Figure 7D:
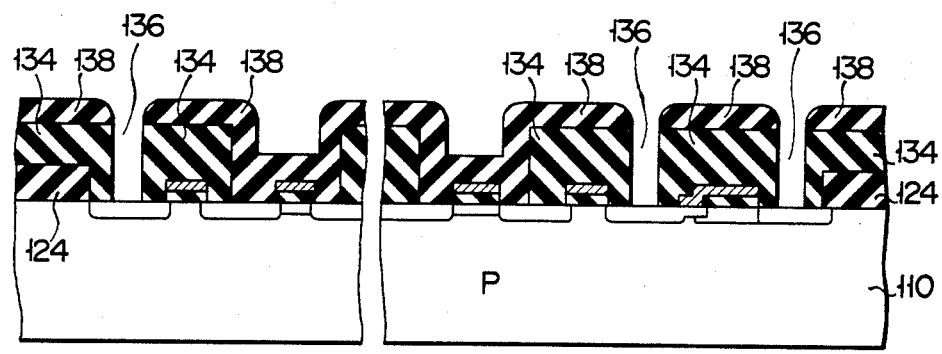

As shown in FIG. 7D, a surface smoothing layer 138 such as a BPSG (boron-doped phospho-silicate glass) film of 5,000 to 7,000 Å is deposited over the surface and the contact holes 136 are opened by the etching process. Of the MOS transistors in the memory region, those of depletion type have no $SiO_2$ film 134. As a result, the surface smoothing layer 138 is also formed in a concave fashion. Accordingly, it is possible to check the stored information from its outer configuration.

Figure 7E:
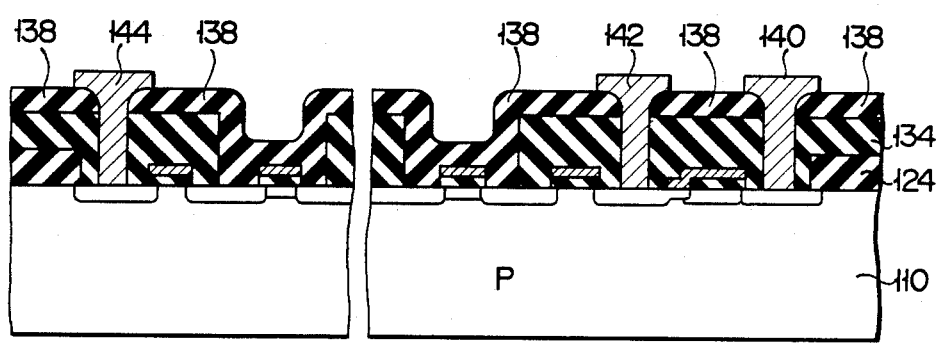

As shown in FIG. 7E, aluminum is vapor-deposited over its entire surface and photo-etched to form a power source terminal 140, an output terminal 142, and a ground terminal 144 at given locations. A protective film (not shown) is then formed over its entire surface. Bonding pads to the exterior are formed, and the chip fabricating process is completed.

The operation of the device will be described referring to the circuit diagram of FIG. 8. The circuit forms one column of the ROM. The power source terminal 140 is a drain region of a load MOS transistor Q0 as an N channel depletion type MOS transistor. The source of the MOS transistor Q0 is connected to the output terminal. In the transistor Q0, the gate and source are connected to serve as a load resistor. Since the transistor Q0 is of the depletion type, the speed of the charge-discharge speed at the output section is improved when the input signal is switched. The source of the transistor Q0 is connected to the drain of the driver transistor Q1 in the memory region. The source of the transistor Q1 is connected to the drain of the next transistor Q2. The source of the transistor Q2 is connected to the drain of the next transistor Q3. This connection is applied to the subsequent transistors Q4 to Qn in succession. Decode lines I1 to In into which the select signals in the column direction are input are connected to the driver MOS transistors Q1 to Qn, respectively. The decode lines I1 to In are of the low potential priority type. The selected decode line is at low potential (almost 0 V). Assume now that the decode line I1 is selected to be at low potential, while the remaining decode lines I2 to In are at high potential, i.e. a potential enabling the enhancement MOS transistor to operate. When the decode line I1 is at low potential, the transistors Q1 is nonconductive. Since the transistors Q2 and Qn−1 are of the depletion type, it is conductive for an input signal from a high potential to 0 V. The enhancement type transistor Qn is conductive since the input signal is at a high potential. As a result, the output signal of the output terminal 142 is at a high potential. This corresponds to a state in which a logic "1" is stored in the selected transistor Q1. In this way, when the transistor of the enhancement type is selected from driver transistors in the memory regions, the output terminal 142 is at high potential. This corresponds to a state in which logic "1" is stored in the transistor.

When the decode line I2 is selected, the transistor Q2 connected to the decode line I2 is conductive irrespective to the presence or lack of presence of the input signal because the transistor Q2 is of the depletion type. The remaining transistors Q1, Qn−1, Qn, etc., are all conductive. This is because the transistor Q1 and Qn receive high potential signal and the transistor Qn−1 is of the depletion type. Accordingly, the output signal from the output terminal 142 is at low potential. This corresponds to a state in which the logic "0" is stored in the transistor Q2. Thus, when the depleton type transistor of the drive MOS transistors is selected, the output signal is at low potential. This indicates that its transistor has stored logic "0". As explained in the preceding description, the semiconductor device functions as a ROM.

In the semiconductor device of the present invention, the ion implantation into the channel region for forming a depletion type driver MOS transistor to determine the memory contents is performed at a later stage of the entire process. The fabricating process steps up to the $SiO_2$ film laying may be performed in advance before the memory contents are determined. Accordingly, after the memory contents are determined through the customer's request and a mask for the memory contents is obtained, the ion implantation into the above-mentioned channel region and the remaining steps are performed. According to this method of the present invention, the period from when the memory contents are specified by a customer until the products storing the contents are completed is considerably reduced. Because the protective film covering the depletion type transistor in the memory region is concave in shape, the contents stored may be checked externally.

After the source region and the drain region of the selected MOS transistor are shorted, the Al interconnection can be formed. Therefore, it is not necessary to form the opening in the channel region which is to be shorted separately from the Al interconnection.

A second embodiment of a method of manufacturing a semiconductor device according to the present invention will be described referring to FIGS. 9A to 9E.

Figure 9A:
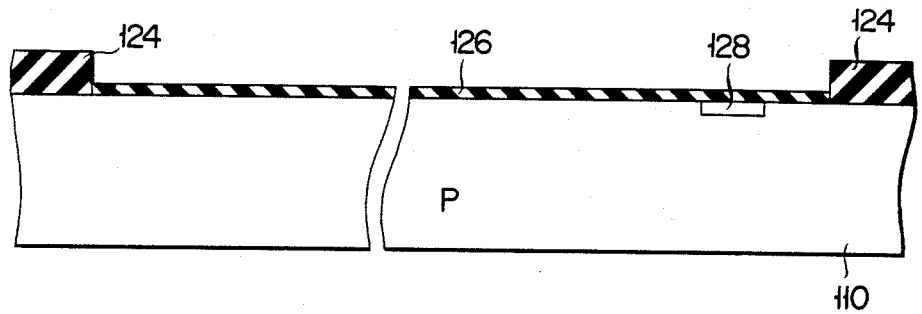
FIGS. 9A to 9E are cross sectional views explaining a second method of manufacturing a semiconductor device according to the present invention.

As shown in FIG. 9A, a $SiO_2$ field oxide film 124 of 8,000 to 15,000 Å in thickness is formed by the thermal oxidation process over the entire surface of a P type silicon substrate 110 which is doped with boron. The field oxide film 124 on the active region on the substrate 110 in which elements are formed is etched away by the photoengraving process. A $SiO_2$ film 126 of 500 to 1,000 Å in thickness is formed on the surface of the exposed substrate 110 by the thermal oxidation process. Then, monovalent phosphorus ions are injected to form an N type impurity region 128 of a depletion type MOS transistor which is to be a load transistor in the circuit.

Figure 9B:
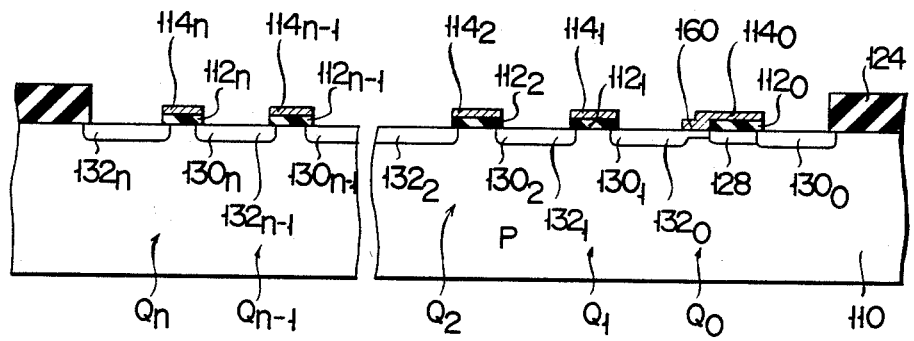

A gate electrode of a polysilicon layer is formed, as shown in FIG. 9B. At this time, in order to short the gate electrode and the source region of the load MOS transistor, the $SiO_2$ 126 on the substrate 110 in which the source region is formed is partially etched away to secure buried contact. Polysilicon of 3,000 to 4,000 Å is deposited on the entire surface of the semiconductor by the CVD process. The polysilicon layer is then subjected to the photoengraving process to form a given pattern, thus forming gate electrodes $114_0$ to $114_n$. At this time, the buried contact portion is also formed. With a mask of the gate electrodes $114_0$ to $114_n$, the $SiO_2$ film 126 is removed to form gate oxide film $112_0$ to $112_n$. With a mask of the gate oxide films $112_0$ to $112_n$, phosphorus is diffused in $POCl_3$ atmosphere to form $N^+$ type drain regions $130_0$ to $130_n$ and source regions $132_0$ to $132_n$ (FIG. 9B).

Figure 9C:
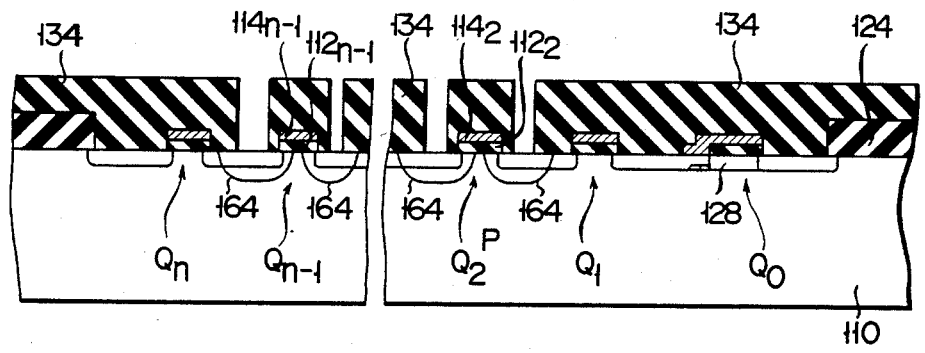

An $SiO_2$ film 134 of 2,000 to 6,000 Å is deposited as a second insulating film by the CVD method over the surface of the semiconductor, as shown in FIG. 9C. The customer's pattern is used from the next step. The $SiO_2$ film 134 covering the source and drain regions of the transistors Q2 and Qn−1 is selectively etched in accordance with a set program. In order to form an N type diffusion layer 164, phosphorus is then gaseous-phase and solid-phase diffused with, for example, $POCl_3$ in the drain and source regions of the MOS transistors Q2 and Qn−1, as shown in FIG. 9C. This diffusion layer 164 is formed so that the source and drain regions of the MOS transistors Q2 and Qn−1 are punched through by an ordinary voltage.

Figure 9D:
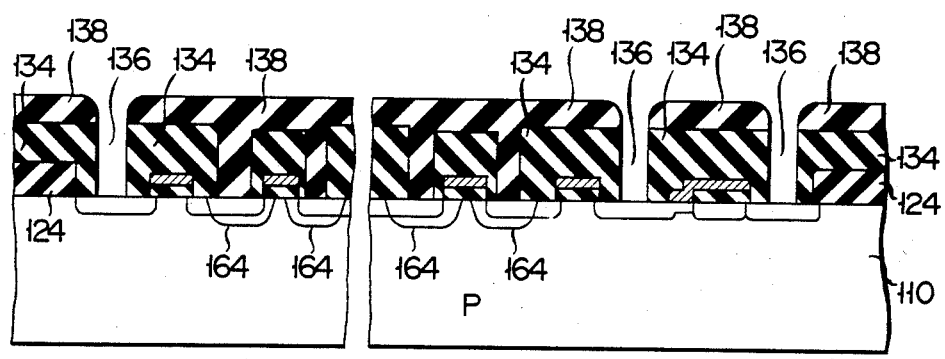

As shown in FIG. 9D, a BPSG film, as an example, is deposited over the surface of the semiconductor, as shown in FIG. 9D, and is then subjected to a thermal process to form surface smoothing layer 138. The contact holes 136 are formed using the photoengraving technique for a power source terminal, an output terminal and an ground terminal.

Figure 9E:
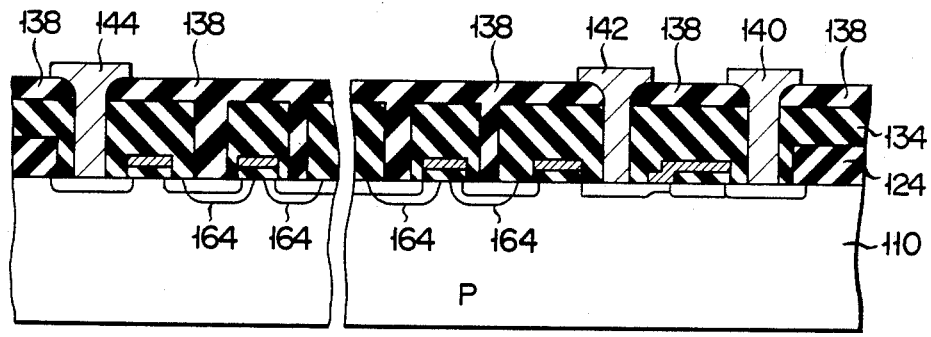

As shown in FIG. 9E, aluminum is vapor-deposited and photoengraved over the entire surface of the semiconductor to form a power source terminal 140, an output terminal 142, and an earth terminal 144. A protective film (not shown) is subsequently provided over the entire surface of the semiconductor and bonding pads to the exterior are formed. At this step, the chip fabricating process is completed.

The circuit arrangement of this semiconductor device is the same as that of FIG. 8. No detailed explanation of the circuit operation will be given.

In the semiconductor device of the present embodiment, the step for shorting the source and drain regions of the depletion type driver MOS transistors to define the contents of the memory is performed in a later stage of the entire fabricating process of the semiconductor device, as in the first embodiment. Accordingly, the process steps before the shorting step can be performed in advance. As a result, the products of the semiconductors can be delivered to customers 5 to 7 days earlier than when compared to the prior art.

The source and drain regions of the transistors Q2 and Qn−1 may be entirely shorted by the N type diffusion layer 164. The diffusion layer 164 may be formed of an oxide doped with phosphorus.

A third embodiment of a method of manufacturing a semiconductor device according to the present invention will be described referring to FIGS. 10A to 10E.

As shown in FIG. 10A, an $SiO_2$ field oxide film 124 of 8,000 to 15,000 Å in thickness is formed over the entire surface of a P type silicon substrate 110 which is doped with boron by the thermal oxide process. The field oxide film 124 on the active region of the substrate 110 in which elements are formed is removed by the photoengraving process. An $SiO_2$ film 126 of 500 to 1,000 Å in thickness, serving as a gate oxide film, is formed by the thermal oxide process over the entire surface of the exposed substrate 110. Monovalent phosphorus ions are implanted in the semiconductor to form an N type impurity region 128 of a depletion type MOS transistor as a load MOS transistor in the circuit.

A gate electrode of a polysilicon layer is formed, as shown in FIG. 10B. At this time, in order to directly short the gate electrode and the source region of the load MOS transistor, the $SiO_2$ film 126 on the substrate on which the source region is formed is partially etched for buried contact purposes. A polysilicon layer of the 3,000 to 4,000 Å is deposited over its entire surface by the CVD process. The polysilicon layer is then photoengraved to form a given pattern and to form gate electrodes $114_0$ to $114_n$. At this time, the buried contact portion 160 is also formed. By using the gate electrodes $114_0$ to $114_n$ as a mask, the $SiO_2$ film 126 is etched away to form gate insulating films $112_0$ to $112_n$. Following this step, by using the gate insulating films $112_0$ to $112_n$ as a mask, phosphorus is diffused in $POCl_3$ atmosphere to form $N^+$ type drain regions $130_0$ to $130_n$ and source regions $132_0$ to $132_n$ (FIG. 10B).

An $SiO_2$ film 134 of 2,000 to 6,000 Å in thickness as a second insulating film is deposited over the surface of the semiconductor by the CVD process, as shown in FIG. 10C. The customer's pattern will be used in the process step following the step just described. An $SiO_2$ film 134 covering the source and drain regions of the transistors Q2 and Qn−1 is selectively etched away in accordance with a set program. After polysilicon is layered over the entire surface of the substrate, the polysilicon layer is thermally activated after doping an impurity of the same conductivity type as the source and drain. The polysilicon layer is selectively etched by the photo engraving process to form a polysilicon layer 166. The polysilicon layer is doped with the same conductivity as the source and drain regions for shorting the source and drain regions of the MOS transistors Q2 and Qn−1.

Figure 10D:
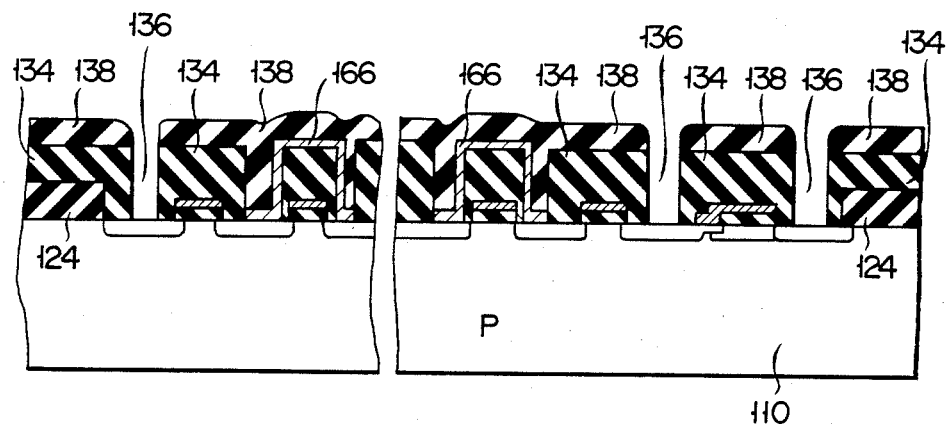

As shown in FIG. 10D, a BPSG film, as an example, is layered on the surface of the semiconductor and is subjected to a heat process to form a surface smoothing layer 138. Contact holes for a power source terminal, an output terminal, and an ground terminal are formed by the photoengraving process.

Figure 10E:
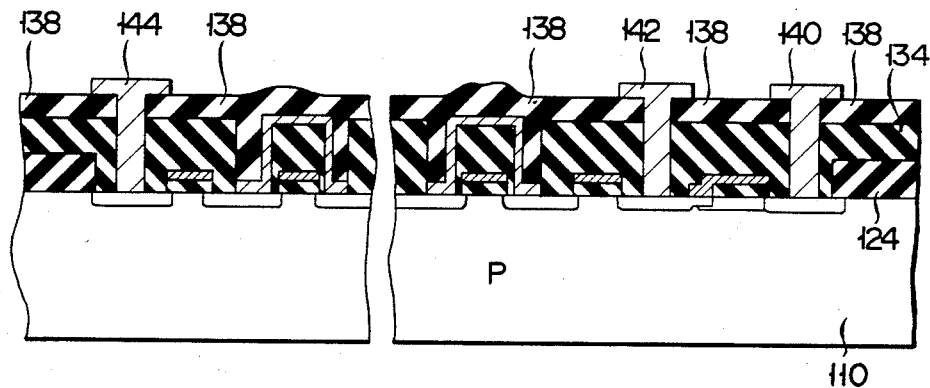

As shown in FIG. 10E, aluminum is vapor-deposited over the entire surface of the semiconductor and is photo engraved to form a power source terminal 140, an output terminal 142, and an ground terminal 144 at given locations. Finally, a protective film (not shown) is formed over its entire surface and bonding pads to the exterior are formed. In this way, the semiconductor device is manufactured.

The circuit arrangement of the semiconductor device as mentioned above is the same as that of FIG. 9. Therefore, the explanation of the circuit will be omitted.

As seen from the foregoing description, in the present embodiment, the step for shorting the source and drain regions of the depletion type MOS transistor for determining the memory content is performed in the later stage of the entire fabricating process of the semiconductor device as in the first embodiment. Therefore, the process steps before the shorting process may be performed in advance.

What we claim is:

1. A method of manufacturing a semiconductor device comprising the steps of:
   (1) forming a first thick insulating film on a semiconductor substrate of a first conductivity type;
   (2) exposing a portion of the surface of said substrate by selectively etching said first insulating film;
   (3) forming a second insulating film on said exposed portion of said substrate;
   (4) forming a first polysilicon layer on said second insulating film;
   (5) forming gate electrodes of a plurality of MOS transistors by partially removing said polysilicon layer;
   (6) doping said gate electrodes and forming a first impurity region of a second conductivity type to be source and drain regions of said MOS transistors in said semiconductor substrate;
   (7) forming a third insulating film on said semiconductor substrate in which said MOS transistors are formed;
   (8) selectively etching the third insulating film and short-circuiting the source and drain regions of a selected MOS transistor in accordance with a set program;
   (9) forming a fourth insulating film on at least said shorted MOS transistor;
   (10) forming contact holes for allowing the formation of electrodes coupled to said first impurity region; and
   (11) forming said electrodes.

2. The method according to claim 1, wherein said step for shorting the source and drain regions of the selected MOS transistor includes the steps of:
   (i) selectively removing said third insulating film on at least the channel region between the source region and drain region of said MOS transistor; and
   (ii) implanting impurity of the second conductivity type into said channel region by using said third insulating film as a mask to form a second impurity region of the second conductivity type for coupling said source and drain regions which constitute said given MOS transistor.

3. The method according to claim 1, wherein said step for shorting the source and drain regions of the selected MOS transistor includes the steps of:
   (i) exposing the source and drain regions of said MOS transistor; and
   (ii) diffusing impurity of the second conductivity type through said exposed portion in order to short said exposed source and drain regions.

4. The method according to claim 1, wherein said step for shorting the source and drain regions of the selected MOS transistor includes the steps of:
   (i) exposing the source and drain regions of said MOS transistor; and
   (ii) forming a second polysilicon layer and doping said layer of the same conductivity as said source and drain regions for shorting said exposed source and drain regions of said MOS transistor.

5. The method according to any one of claims 1 to 4, wherein said step for forming said first impurity region includes the steps of:
   (i) forming a plurality of gate insulating films for said MOS transistors by etching said second insulating film with a mask of said gate electrodes;
   (ii) forming said first impurity region of the second conductivity type to be the source and drain regions of said MOS transistors on said semiconductor substrate, with a mask of said gate insulating films and said first insulating film.

6. The method according to any one of claims 1 to 4, wherein said first impurity region of the second conductivity type to be the source and drain regions of said MOS transistors is formed on said semiconductor substrate by an ion implantation process with a mask of said gate electrodes.

7. In the fabrication of a silicon semiconductor field effect memory device wherein spaced apart source and drain areas are formed on a substrate with a channel extending therebetween and a control gate is formed above the channel with an oxide insulating layer covering the gate and device, an improvement to the process that allows the device to be converted into a normally conducting device late in the fabrication process comprising:
   masking and etching the device so as to create openings to the source and drain areas on the substrate beside the control gate; and
   doping said source and drain areas through said openings so as to expand said areas toward each other, under said gate, until they form a continuous conduction path.

8. The process of claim 7 in which said source and drain areas are additionally doped by forming a doped oxide insulating layer on said device and in said opening.

9. The process of claim 7 in which the source and drain areas are additionally doped with phosphorus through said openings and thereafter an insulating oxide layer is formed on said device and in said openings.

* * * * *